United States Patent [19]

Roberts et al.

[11] Patent Number: 4,975,595

[45] Date of Patent: Dec. 4, 1990

[54] SCANNABLE REGISTER/LATCH CIRCUIT

[75] Inventors: Scott Roberts, Puyallup, Wash.; Daniel Chang, Beaverton, Oreg.

[73] Assignee: National Semiconductor Corporation, Santa Clara, Calif.

[21] Appl. No.: 221,701

[22] Filed: Jul. 20, 1988

Related U.S. Application Data

[63] Continuation of Ser. No. 61,834, Jun. 12, 1987, abandoned.

[51] Int. Cl.[5] ........................ H03K 3/289; H03K 3/37; H03K 19/86
[52] U.S. Cl. .................. 307/272.2; 307/289; 307/291; 307/455
[58] Field of Search ............... 307/272.2, 289, 291, 307/455; 377/115, 77, 116; 365/155, 177, 179

[56] References Cited

U.S. PATENT DOCUMENTS

| | | | |
|---|---|---|---|
| 4,277,699 | 7/1981 | Brown et al. | 307/291 |
| 4,528,465 | 7/1985 | Harvey | 307/455 |
| 4,540,903 | 9/1985 | Cooke et al. | 307/272.2 |
| 4,628,216 | 12/1986 | Mazumder | 307/455 |
| 4,628,217 | 12/1986 | Berndt | 307/272.2 |
| 4,686,394 | 8/1987 | Lam | 307/272.2 |
| 4,689,497 | 8/1987 | Umeki et al. | 307/272.2 |
| 4,725,979 | 2/1988 | Hoberman | 307/455 |

FOREIGN PATENT DOCUMENTS

| | | | |
|---|---|---|---|
| 0209464 | 1/1978 | European Pat. Off. | 307/272.2 |
| 0143513 | 6/1987 | Japan | 307/272.2 |

Primary Examiner—Stanley D. Miller
Assistant Examiner—Tai V. Duong
Attorney, Agent, or Firm—Lee Patch; Robert C. Colwell; Charles E. Krueger

[57] ABSTRACT

A circuit is described for functioning as a transparent latch, a latch where the data is determined by the state of a data signal at the time a signal changes state, a D-type flip-flop, and a scan path element. The mode of operation of the circuit is determined by the condition of respective ones of a set of control signals.

25 Claims, 4 Drawing Sheets

SCANNABLE REGISTER/LATCH CIRCUIT

This application is a continuation-in-part of Ser. No. 61,834, filed June 12, 1987, now abandoned.

BACKGROUND OF THE INVENTION

1. Field of the Invention

This invention relates to electronic circuits and in particular to an electronic circuit which at the option of the user will function as a register, a latch, or a scan path circuit depending upon control signals supplied thereto.

2. Description of the Prior Art

Individual circuits for providing latches are well known. In a conventional latch, data present at an input terminal is "latched" onto an output terminal at the time a control signal changes state. The data latched onto the output terminal remains there for as long as the control signal remains in that state, regardless of whether new data are presented to the input terminal. A typical application for a latch is "debouncing" switch signals in which an output signal is latched onto an output terminal after transients dissipate from a sensing node.

Also well known are circuits for flip-flops. In a flip-flop the circuitry is capable of being in one of two stable states which may be used to represent a stored 0 or 1, respectively. In a D-type flip-flop, the output Q after a clock pulse is equal to the input D before the pulse. Thus, a D-type flip-flop is a binary device used to provide a one-bit delay. Flip-flops find wide application as registers in digital circuits.

Circuits for providing elements for scan paths are also well known. A scan path allows a sequence of storage elements individually coupled to other data processing elements to be individually accessed and tested. Using a scan path in conjunction with other processing circuitry enables a high degree of testability of that circuitry. For example, in circuits with scan path elements, if the circuitry is disabled and the scan path enabled, desired data may be scanned into various locations in the processing circuitry. Then the scan path is disabled and the processing circuitry enabled for one or more cycles. The processing circuitry then may be disabled and the scan path reenabled to scan out the data produced by the cycle(s) of operation of the processing circuitry to verify the correctness of the processing operation performed. This procedure may be repeated as necessary to provide a complete test of every processing element to which a scan path element is coupled.

Although individual ones of the above-described circuits are available to integrated circuit users, devices have not been available which enable a user to of a single part to select the particular functionality desired. Furthermore, the absence of this capability has made it necessary for manufacturers of the devices to manufacture separate devices for different users, as opposed to a universal device capable of performing these functions. For example, a supercomputer manufacturer might require a particular part incorporating latches while a minicomputer manufacturer might require the same part with registers. Thus, the manufacturer of the integrated circuit must fabricate and inventory both parts. This has resulted in higher cost and lower availability for the parts in question.

SUMMARY OF THE INVENTION

We have invented a scanable register/latch circuit, which depending upon control signals supplied to it, may operate in several different modes -- as a transparent latch where the output follows the data, as a latch where the data is latched at the time a control signal changes state, as a D-type flip-flop, and as a scan path element circuit. This circuitry allows the user of my invention to select the mode in which he wishes the circuit to function by application of the control signals. In contrast, circuits of the prior art required a dedicated circuit to provide each of the above functions, thereby requiring the user to maintain an inventory of different circuits, and necessitating fabrication of different circuits by the integrated circuit manufacturer.

In the preferred embodiment my circuit for supplying an input signal to an output terminal includes a master circuit connected to receive the input signal, and a slave circuit connected to the output terminal and connected to receive the input signal, and selectively connectable to the master circuit. In my circuit, a first set of control signals disables the master circuit and cause the slave circuit to provide the input signal directly to the output terminal, while a second set of control signals disables the master circuit and causes the slave circuit to latch the input signal onto the output terminal at a time when one of the second set of control signals changes state. Additionally, a third set of control signals causes the slave circuit to receive data from the master circuit and supply that data to the output terminal.

DETAILED DESCRIPTION OF THE PREFERRED EMBODIMENT

Figure 1A:
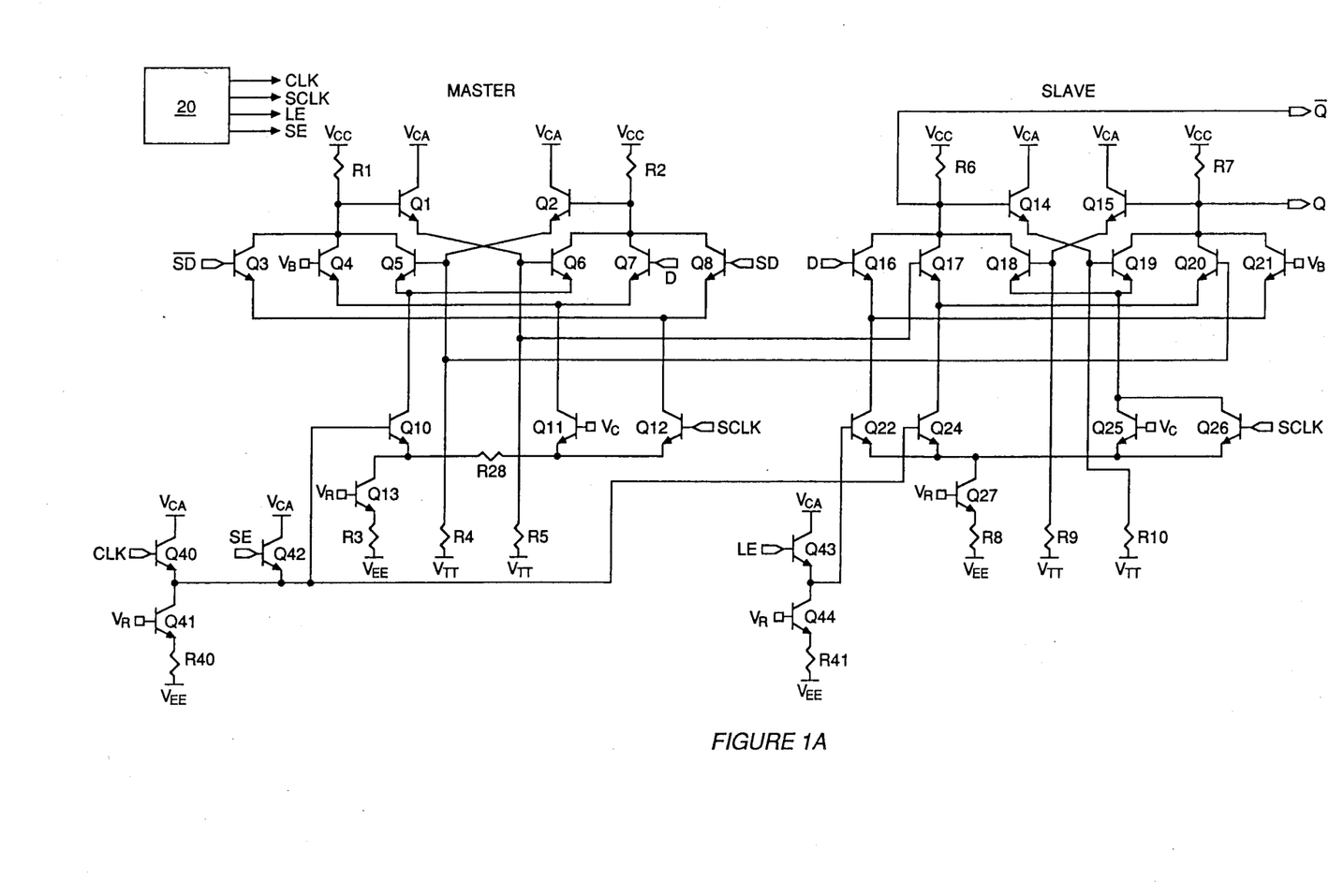
FIG. 1A is a circuit schematic of the scannable register/latch circuit.

FIG. 1A is a schematic of a preferred embodiment of the scannable register/latch circuit of my invention. The circuit itself is described below, followed by a description of its operation as a scannable register/latch. The circuit shown in FIG. 1A includes a master latch and a slave latch comprising a master/slave type flip-flop. The master portion includes a first master latch mode (MSL) pair of transistors Q5 and Q6 having emitters commonly-coupled to the collector of MLM select transistor Q10. A second register mode (RM) pair of emitter-coupled devices Q4 and Q7 are connected to the collector of RM select transistor Q11, while a third scan mode (SM) pair of emitter-coupled devices Q3 and Q8 are connected to the collector of SM select transistor Q12. The collectors of Q3, Q4, and Q5 are coupled to a master left hand side (LHS) terminal N1 and the collectors of Q6, Q7, and Q8 are coupled to a master right hand side (RHS) terminal N2. This portion of the depicted circuit operates in a bistable manner with the collector currents of transistors Q10, Q11, and Q12 being supplied by one or the other of each of the pairs of emitter-coupled devices.

An emitter follower consisting of transistor Q1 and resistor R5 is connected to the base of transistor Q6, while a similar emitter follower consisting of transistor Q2 and resistor R4 is connected to the base of transistor Q5. These emitter followers are controlled by the signals applied to the bases of transistors Q1 and Q2. A reference voltage $V_R$ applied to transistor Q13, in conjunction with resistor R3, provides a master current source for the emitters of transistors Q10, Q11, and Q12. A similar current source comprising transistor Q41 and resistor R40 is coupled to the emitters of transistors Q40 and Q42. Resistor 28 provides an apparent threshold shift for certain clock signals, as will be discussed below.

A reference source $V_{CC}$ of 0 volts is coupled through resistor R1 to the commonly-connected collectors of transistors Q3. Q4, Q5. A similar arrangement connects potential $V_{CC}$ through resistor R2 to the collectors of transistors Q6. Q7 and Q8. A similar potential $V_{CA}$ is connected to the collectors of Q1 and Q2. Potentials $V_{CA}$ and $V_{TT}$ are reference sources used for the current sources to minimize the effect of device switching on the stability of the other reference sources. Reference source $V_{EE}$ is approximately $-4.5$ volts, while $V_{TT}$ is $-2.0$ volts. $V_C$ and $V_B$ are each slightly more negative than $V_{CC}$.

An input data signal D is applied to the base of transistor Q7 for comparison with reference potential $V_B$. True and complementary scan data input signals, SD and $\overline{SD}$, are applied to the bases of transistors Q8 and Q3, respectively. The scan clock signal SCLK is applied to the base of transistor Q12, while the clock signal CLK is applied to the base of transistor Q40. A scan enable signal SE is applied to the base of transistor Q42. The transistors Q40 and Q42 function as an OR gate having an output signal, MCLK, coupled to the bases of the MLM select transistor Q10 and an STM select transistor Q24. The signal LE is coupled to the base of transistor Q43 which generates an LCLK signal coupled to the base of an LEM select transistor Q22.

As shown in FIG. 1A, the circuitry of the slave latch includes a fourth slave latch mode (SLM) pair of transistors Q18 and Q19 having emitters commonly coupled to the collector of a first and second SLM select transistors Q25 and Q26. A fifth slave transparent mode (STM) pair of emitter coupled devices Q17 and Q20 are connected to the collector of STM select transistor Q24 while a sixth latch enable mode (LEM) pair of emitter-coupled transistors Q16 and Q21 are coupled to the collector of LEM select transistor Q22.

The data signal D drives the base of transistor Q16 for comparison, again, with potential $V_B$ on the base of transistor Q21. The scan clock signal SCLK is coupled to the base of transistor Q26, and a latch enable signal LE controls transistor Q43. The true output signal Q is generated at an RHS output terminal N3 coupled to the common collectors of transistors Q19, Q20 and Q21, while the complementary output signal $\overline{Q}$ is generated at an LHS output terminal N4 coupled to the common collectors of transistors Q16, Q17 and Q18.

The circuitry depicted in FIG. 1A is capable of operating in four different modes. In a first mode it operates as a transparent latch where the output Q, $\overline{Q}$ follows the data D. In a second mode the circuit operates as a latch where the output is latched to whatever the data was at the time the latch enable signal LE was turned off. The third mode of operation is as a conventional D-type flip-flop in which a rising edge on the clock line captures the data.

The final mode of operation is as a scan path in which the scan data inputs SD and $\overline{SD}$ are transferred through a sequence of daisy-chained circuits, each one of which is of the type depicted in FIG. 1. This mode allows desired data to be scanned in or scanned out of a set of daisy-chained circuits thereby enabling complete testability of associated circuitry. The specific operation of each mode is discussed further below.

Figure 1B:
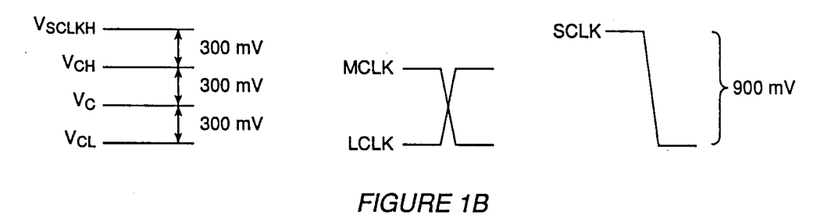
FIG. 1B is a schematic diagram depicting the voltage levels of the control signals utilized in the embodiment of FIG. 1A.

FIG. 1B depicts the signal levels of the MCLK, LCLK, and SCLK signals. The technique utilized to get essentially three levels of series gating functionality in just two levels is to run SCLK at an expanded swing. Thus, SCLK high overrides MCLK high so that SCLK swing around MCLK while MCLK swings around the reference $V_C$. The control signal generating unit 20 includes ECL circuitry for generating the signal voltage levels $V_{CL}$, $V_C$, $V_{CH}$, $V_{SCLKH}$ and for clocking the control signals LE, CLK, SE, and SCLK according to the timing requirements described below. The circuitry for implementing the functionality is well-known in the art and not part of the present invention.

In the first mode of operation, the circuit acts as a transparent latch in which the Q and $\overline{Q}$ output signals follow the data. In this mode of operation, the clock signal CLK on the base of transistor Q40 is off so that the MCLK signal is at $V_{CL}$ and the latch enable signal LE on the base of transistor Q43 is on so that LCLK is at $V_{CH}$. The scan enable signal SE and the scan clock signal SCLK are also off to prevent the state of the output lines Q and $\overline{Q}$ from being affected by the master side of the circuit. The signal on transistor Q43, in an emitter follower configuration, controls the LEM select transistor Q22 and turns it on. Transistor Q22 draws its collector current through either transistor Q16 or transistor Q21 depending upon the state of the data signal coupled to the base of transistor Q16. If the data signal D is on, then the current in the collector of Q22 will go through transistor Q16, thereby pulling the complementary output $\overline{Q}$ low. At the same time transistor Q21 will be turned off, thereby causing the Q output to go high. On the other hand, if the data bit D is low, then transistor Q22 will draw its collector current through transistor Q21, while transistor Q16 will be off. In this configuration the Q output will be low and the $\overline{Q}$ output will be high. Notice that because the scan enable SE and clock CLK signals are low, the STM select transistor is off and the input signals from the master side to transistor pair Q17 and Q20 of the slave circuit have no effect upon the output signals Q and $\overline{Q}$.

In the second mode of operation, the circuit of FIG. 1A functions as a latch where the data latched onto the Q and $\overline{Q}$ outputs is determined by the state of the data signal at the time the latch enable signal LE is turned off. In this mode of operation, as in the previous discussed mode, both the clock signal CLK and scan enable SE signals are low to prevent the master side of the flip-flop from influencing the Q and $\overline{Q}$ output lines.

Prior to this latching mode, the collector current for transistor Q22 will be supplied by either transistor Q16 or transistor Q21 depending upon the state of the data D. At the instant the latch enable signal goes low, whatever current was flowing through transistor Q22 must then flow through transistor Q25, because transistors Q24 and Q26 are off. The current through transistor Q25 must flow from either transistor Q18 or transistor Q19. If at the instant the latch enable signal LE was turned off, the true output Q was high, then transistor Q18 will turn on and pull the $\overline{Q}$ output low while the Q output remains high. On the other hand, if the Q output was low at the time control signal LE went off, then transistor Q19 is turned on to pull the output Q low while output $\overline{Q}$ goes high. In either case, the resultant output signals Q and $\overline{Q}$ are in a latched state which now is independent of the data input D.

In the third mode of operation, the circuitry depicted operates as a conventional D-type flip-flop. In this mode the output Q after a clock pulse will be the same as the input D before the clock pulse. The circuit is placed in a D-type flip-flop configuration by turning off the latch enable LE and scan enable SE control signals. The scan clock signal SCLK also remains off. In this mode of operation, one of the master or slave circuits functions like a latch, while the other behaves in a transparent mode. The condition of the latch circuit in this regard is controlled by the clock signal CLK. When the clock signal CLK is on, MCLK is set to $V_{CH}$. From FIG. 1B, Q24 is turned on harder than Q22, Q25, or Q26 so that Q17 and Q20 conduct. Thus, the slave obtains data from the master, which is in a latch mode. When the clock signal goes low, MCLK is set to $V_{CL}$. From FIG. 1B, Q11 is turned on harder than Q10 and Q12 so that Q4 and Q7 conduct and the master latch responds to the register data D. Q25 is also turned on harder than Q22 or Q24 so that Q18 and Q19 conduct and the slave latch is in a latch mode. On the rising edge of the clock signal, the master latches the data, and the slave transfers the data to output lines Q and $\overline{Q}$.

More particularly, if the clock signal CLK is high, the STM select transistor Q24 is on, and the slave is functioning in a transparent mode with the collector of the STM select transistor Q24 drawing current through either transistor Q17 or transistor Q20, depending upon the state of the master. During this period the master side is not affected by the state of the data bit, so the data may change. When the clock signal CLK goes low, the master is placed into a transparent mode because the MLM select transistor Q10 is turned off. In this condition the current through the collector of RM select transistor Q11 will be controlled by comparison potentials $V_B$ and the signal D to the base of Q7. The slave flip-flop is placed in a latch mode (as described above for the mode in which LE is off).

The fourth mode of operation is the scan mode in which the data input to nodes SD and $\overline{SD}$, the bases of transistors Q8 and Q3, respectively, is transferred to the output lines Q and $\overline{Q}$. This mode is achieved by turning on the scan enable transistor Q42 which sets MCLK to $V_{CH}$. The scan clock signal SCLK applied to the base of the SM select transistor Q12 then turns it on, with its collector current being supplied by whichever of transistors Q3 and Q8 is on. From FIG. 1B, when SCLK is at SCLKH the SM select transistor Q12 is turned on harder than Q10 or Q11 so that Q3 and Q8 conduct and the master latch responds to the scan inputs S and $\overline{S}$. Also, the second SLM select transistor Q26 is turned on harder than Q22, Q24, or Q25 so that Q18 and Q19 conduct and the slave latch is in a latched state. The high scan clock signal SCLK places the slave circuit in a latch mode by turning on transistor Q26. In effect, the circuit now becomes a negative edge triggered D-type flip-flop controlled by the scan data signals SD and $\overline{SD}$ instead of the data signal D. The scan enable signal SE keeps the master circuit in a latched state and the slave circuit in a transparent state when the SCLK signal is low.

Resistor R28 provides an apparent threshold shift for the master clocks (CLK, SE. SCLK) versus the slave clocks (CLK, SE, SCLK). This allows the same clock signals to be applied to both the master and slave, but nullifies the race condition inherent in a master/slave flip-flop. When in the positive edge triggered D-type flip-flop mode, the master has a clock threshold lower than the slave. Therefore, on the falling edge of the clock signal the data from the master is latched into the slave before the master switches to transparent mode. Conversely, in the negative edge triggered scan flip-flop mode, the master has a scan clock threshold higher than the slave. Therefore, on the rising edge of the scan clock signal, the data from the master is latched into the slave before the master switches to transparent.

Figure 2:
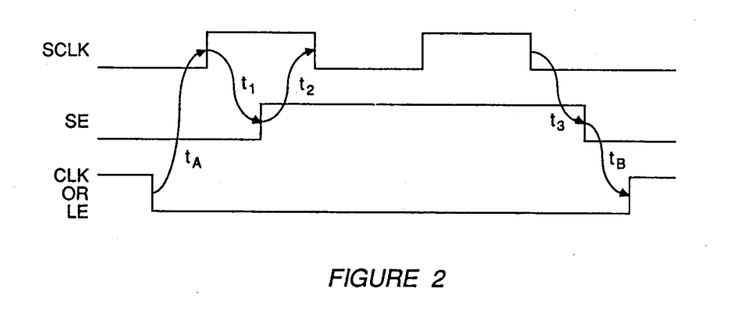
FIG. 2 is a timing diagram illustrating certain required timing relationships.
Figure 3:
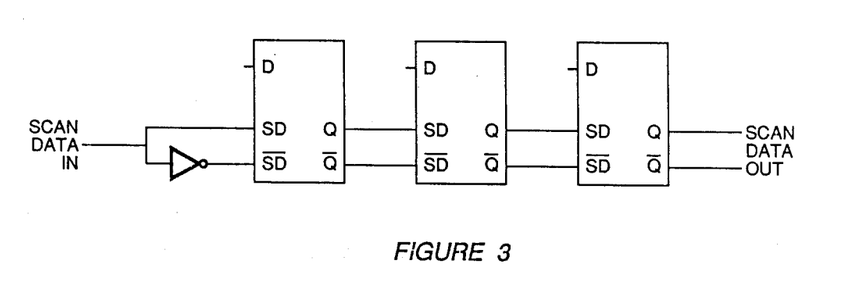
FIG. 3 is a block diagram illustrating "daisy chaining" of several of the circuits of FIG. 1.

For proper operation, the circuit of FIG. 1 requires observance of certain clock timing rules in conjunction with the scan capability. The scan clock SCLK and scan enable SE signals must follow certain timing rules. First, as shown in FIG. 2, the scan clock SCLK must go high prior to the scan enable SE going high. This insures that the data in the slave portion of the register is saved when the circuit enters scan mode. The delay between scan enable going high and scan clock going high is termed t1 in FIG. 2. Second, before switching low, the scan clock SCLK must wait until after the scan enable signal SE goes high. This set-up time is labeled t2 on FIG. 2.

The third timing requirement is that the scan enable signal SE must not switch low until after the scan clock SCLK goes low. This condition assures that the scan data SD on the input node is saved when exiting the scan mode. The necessary time delay is labeled t3 in FIG. 2. It should also be noted that the clock CLK and latch enable LE signals are forced low prior to the entering of scan mode and remain low until the scan mode is complete. The delay following the clock CLK or latch enable LE signals going low before the scan clock may go high is designated tA in FIG. 2, while the delay time before the clock CLK or latch enable LE may switch high after the scan enable SE goes low is designated time tB in FIG. 2.

Referring again to FIG. 1B, the separation between the various voltage levels depicted is typically on the order of 300 mV. Accordingly, the full voltage swing between $V_{CL}$ and $V_{SCLKH}$ is on the order of 900 mV. Standard ECL voltage drivers provide for only a 600 mV. swing and thus a special driver is required to provide the extra 300 mV. to generate $V_{SCLKH}$. Further, because the scan mode utilizes negative edge triggering, extra clock circuitry is required to implement the timing restrictions depicted in FIG. 2 during transition between the positive edge triggered register mode and the negative edge triggered scan mode.

Figure 4:
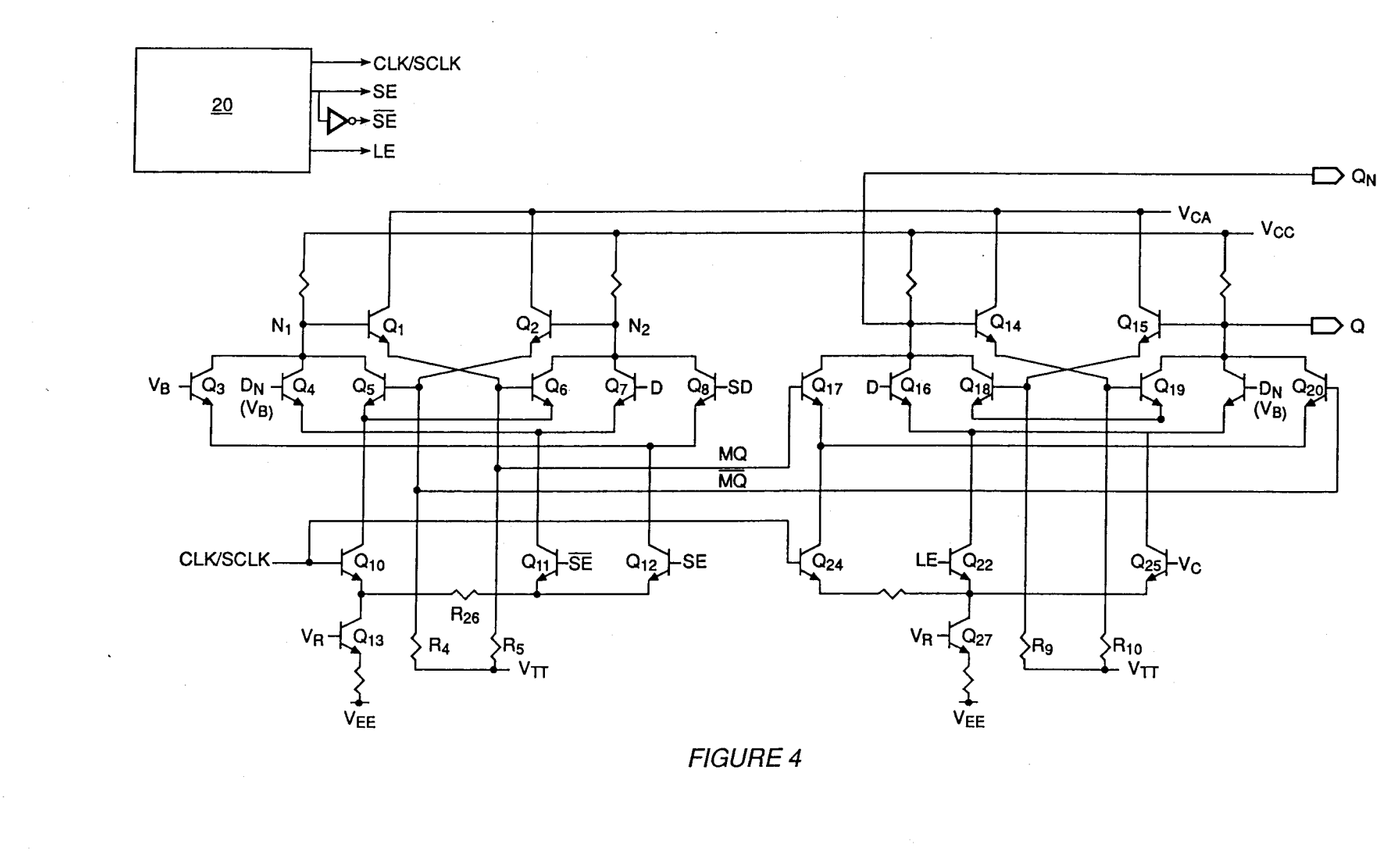
FIG. 4 is a circuit schematic of an alternative embodiment of a scannable register/latch circuit.

An alternative embodiment is depicted in FIG. 4. Referring to FIG. 4, transistors having the same function as the transistors of FIG. 1 are assigned the same reference numerals. The primary structural differences are the lack of a second SLM select transistor Q26 and the lack of the MCLK and LCLK generating transistors Q40, Q41, Q42, Q43, and Q44. In the circuit of FIG. 4 the control signals are applied directly to the bases of the various select transistors with appropriate ECL voltage levels. Specifically, the CLK/SCLK signal is applied to the MLM and STM transistors ($Q_{10}$ and $Q_{24}$), the $\overline{SE}$ signal is applied to the RM select transistor ($Q_{11}$), the SE signal is applied to the SM select transistor ($Q_{12}$), and the LE signal is applied to the LEM select transistor $Q_{22}$).

Figure 5:
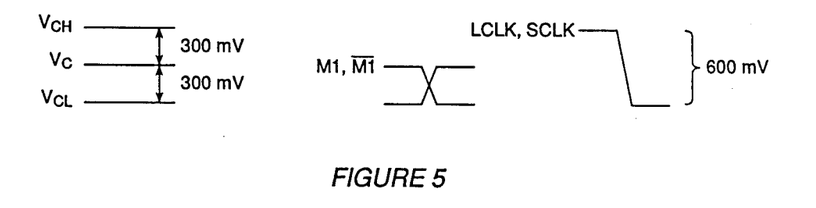
FIG. 5 is a schematic diagram depicting the voltage levels of the control signals utilized the embodiment of FIG. 4.

In FIG. 5 the voltage levels of the control signals are depicted. The total swing of the signals is the standard 600 mV, with the swing of the SE/$\overline{SE}$ signal being half the CLK/SCLK signal. Accordingly, no special driver circuits are required.

Figure 6:
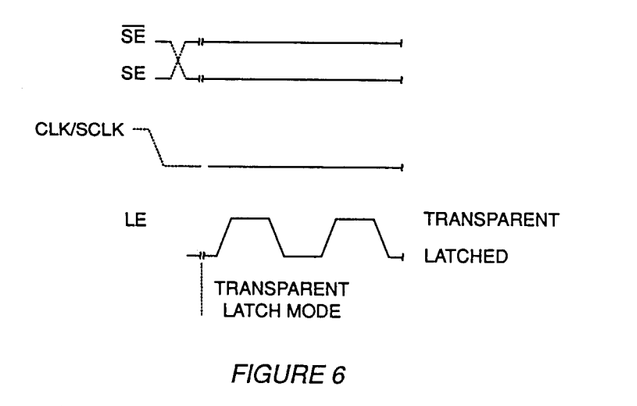
FIG. 6 is a table listing the states of the control signals for operating the circuit of FIG. 4 in the register mode, scan mode, and latch mode.
Figure 7:
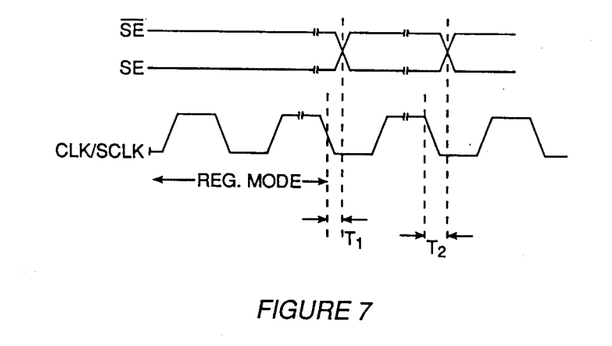

The timing requirement of the signal CLK/SCLK. LE, and SE to operate in the various modes and make transitions between the modes are illustrated in FIGS. 6 and 7. Referring to FIG. 6, operation in the transparent latch mode is illustrated.

Prior to entering the latch mode, $\overline{SE}$, SE, and CLK/SCLK are switched low isolate the slave latch from the MQ, M$\overline{Q}$ outputs of the master latch. In particular, when CLK/SCLK is low the STM transistor $Q_{24}$ is off so no current is supplied to $Q_{17}$ or $Q_{20}$. When LE is low the outputs remain latched at a previously established level. However, when LE is switched high, the LEM transistor ($Q_{22}$) conducts and the outputs of the slave latch follow the level of the slave D signal and is transparent.

Referring now to FIG. 7, the operation of the register and scan modes will be described. The states of SE/$\overline{SE}$ control whether the RM select transistor ($Q_{11}$) conducts and the master latch responds to the Data input signal or the SM select transistor ($Q_{12}$) conducts and the master latch responds to Scan Data input signal.

When CLK/SCLK is low, the MLM transistor ($Q_{10}$) is off so the master latch is transparent and the master latch outputs, MQ and M$\overline{Q}$, follow the selected inputs. Additionally, the STM select transistor ($Q_{24}$) is off so that the slave latch outputs are latched to a previously established value.

When CLK/SCLK is high, the MLM transistor ($Q_{10}$) is on so the master latch outputs are latched and the STM select transistor ($Q_{24}$) is on so the slave latch is transparent and the slave latch outputs follow the master latch outputs.

Further, during a transition between the register mode and the scan mode, the SE/$\overline{SE}$ signals are not switched until a predetermined time after the CLK/SCLK signal is switched low. This timing assures that the slave latch is latched prior to switching the master latch outputs between the data input levels and the scan input levels. Thus, the transition between these levels is not reflected at slave latch outputs until CLK/SCLK is switched.

Thus, this embodiment requires only three independent control signals to operate in the three modes. Further, the levels of the control signals are standard ECL levels and no special driver circuits are needed. A single clock signal, CLK/SCLK, is used in both the register and scan modes and all modes are positive edge triggering.

Although the preceding has been a description of the preferred embodiment in which specific circuitry and timing details have been provided, it should be appreciated that this information is intended to explain the invention and not to limit it. The scope of the invention may be ascertained from the following claims.

We claim:
1. A multifunctional circuit, controlled by a set of control signals, for supplying an output data signal to a circuit output terminal
   a master latch circuit, having a data input terminal to receive a first data input signal, for providing a master output data signal at a master output terminal;
   a salve latch circuit connected to the circuit output terminal, having a slave data input terminal to receive the first data input signal and having a master data input terminal connected to the master output terminal; and
   first and second slave switches, included in said slave circuit and with the first slave switch responsive to a latch clock signal and the second slave switch responsive to a master clock signal, with said first and second switches for causing the slave circuit to provide the first data input signal received at the slave input terminal directly to the circuit output terminal when the latch clock signal is asserted and the master clock signal is not asserted, for causing the slave circuit to latch a signal currently on the circuit output terminal when the latch clock signal is not asserted and the master clock signal is not asserted and for causing the slave circuit to receive data from the master circuit output terminal and supply that received data directly to the circuit output terminal when the master clock signal is asserted and the latch clock signal is not asserted;
   a first master switch, included in said master latch and responsive to said master clock signal, for causing said master latch to latch data onto said master latch terminal when said master clock signal is asserted so that said multifunctional circuit may function either as a transparent latch, a latch, or a D type flip-flip under control of said latch clock and master clock signals.

2. A circuit as in claim 1 wherein the master latch circuit further comprises a scan input terminal connected to receive a scan data input signal and where said circuit further comprises:
   means for asserting said master clock signal to enable a scan mode;
   a second master switch, included in said master latch circuit and responsive to a scan clock signal, with said first and second master switches for causing said master latch circuit to provide said scan data input signal directly to said master latch output terminal when said scan clock signal is asserted during said scan mode and to latch said scan data input signal onto the master output terminal when said scan clock signal is not asserted during said scan mode;
   a third slave switch, included in said slave latch circuit and responsive to the scan clock signal, with said second and third slave switches for causing said slave latch circuit to be in a latched state when said scan clock signal is asserted during said scan mode and to provide the scan data input signal latched at said master latch output terminal directly to the circuit output terminal when said scan clock signal is not asserted during the scan mode so that said multifunctional circuit may further be utilized to form a scan data path.

3. A circuit as in claim 1 wherein the master circuit comprises:

a first pair of cross-coupled transistors for maintaining a potential difference between a first and a second terminal, the first pair having emitters commonly connected through a first transistor to a first node;

a second pair of transistors having emitters commonly connected through a second transistor to a second node, the second node being coupled to the first node, each of the second pair being connected to a separate one of the first pair, and one of the second pair being connected to receive the input signal while the other of the second pair is connected to receive reference potential; and a first current source connected to the first node.

4. A circuit as in claim 3 wherein the first and second nodes are resistively coupled.

5. A circuit as in claim 3 wherein:
a collector of one of the second pair is connected to a collector of a corresponding one of the first pair, and also connected to the first terminal; and
a collector of the other of the second pair is connected to a collector of the other of the first pair, and also connected to the second terminal.

6. A circuit as in claim 3 further comprising:
a third pair of transistors having emitters commonly connected through a third transistor to the second node, one of the third pair being connected to receive a scan data signal.

7. A circuit as in claim 6 wherein:
a collector of one of the third pair is connected to the first terminal; and
a collector of the other of the third pair is connected to the second terminal.

8. A circuit as in claim 3 wherein the slave circuit comprises:
a fourth pair of cross-coupled transistors for maintaining a potential difference between the output terminal and an inverted output terminal, the fourth pair having emitters commonly connected through a fourth transistor to a third node;
a fifth pair of transistors having emitters commonly connected through a fifth transistor to the third node, each of the fifth pair being connected to a separate one of the fourth pair, one of the fifth pair being connected to receive the reference potential while the other of the fifth pair is connected to receive the input signal; and
a second current source connected to the third node.

9. A circuit as in claim 8 further comprising:
a sixth pair of transistors having emitters commonly connected through a sixth transistor to the third node.

10. A circuit as in claim 9 wherein:
a collector of one of the sixth pair is connected to a collector of one of each of the fourth and fifth pair and to the output terminal.

11. A circuit as in claim 10 wherein a collector of the others of all of the fourth, fifth and sixth pairs is connected to the added terminal.

12. A circuit as in claim 9 further comprising:
means for supplying a clock signal to both the first and sixth transistors; and
means for supplying a latch enable signal to the fifth transistor.

13. A circuit as in claim 10 wherein the first pair of transistors is also connected to the sixth pair of transistors.

14. A bipolar circuit comprising:

a first pair of transistors having emitters connected together and through a first transistor to a first node; a base of a first one of the first pair being coupled through a first terminal to a collector of the second one of the first pair and a base of the second one of the first pair being coupled through a second terminal to a collector of the first one of the first pair;

a second pair of transistors having emitters connected together and through a second transistor to a second node, a first one of the second pair having a collector connected to the second terminal and a base connected to a reference potential, a second one of the first pair having a collector connected to the first terminal and a base connected to receive an input signal; and a third pair of transistors having emitters connected together and through a third transistor to the second node, a first one of the third pair having a collector connected to the second terminal and a base connected to receive scan data, a second one of the third pair having a collector connected to the first terminal and a base connected to receive scan data.

15. A circuit as in claim 14 further comprising:
a fourth pair of transistors having emitters connected together and through a fourth transistor to a third node; a base of a first one of the fourth pair being coupled through a third terminal to a collector of the second one of the fourth pair and a base of the second one of the fourth pair being coupled through, a fourth terminal to a collector of the first one of the fourth pair;

a fifth pair of transistors having emitters connected together and through a fifth transistor to the third node, a first one of the second pair having a collector connected to the fourth terminal and a base connected to receive the input signal, a second one of the fifth pair having a collector connected to the third terminal and a base connected to the reference potential; and a sixth pair of transistors having emitters connected together and through a sixth transistor to the third node, a first one of the third pair having a collector connected to the fourth terminal and a base connected to the base of the second one of the first pair, a second one of the sixth pair having a collector connected to the third terminal and a base connected to the base of the first one of the first pair.

16. A circuit as in claim 15 wherein
clock signal is supplied to the bases of both the first and sixth transistors:
a reference signal is supplied to the bases of both the second and fourth transistors; and
a latch enable signal is supplied to the base of the fifth transistor.

17. A circuit as in claim 16 further comprising:
a seventh transistor having an emitter and collector connected in parallel with the fourth transistor: and
wherein a scan enable signal is supplied to the bases of the first and sixth transistors and a scan clock signal is supplied to the base of the seventh transistor.

18. An emitter coupled logic (ECL) circuit structure for receiving register input data and register scan input data, that selectively functions as a register to transfer the received register input data to a set of output terminals (register mode), as a scan register to transfer the received scan register data to the output terminals (scan mode), or as a latch element for the received register data (latch mode), with the circuit structure including coupled master and slave latches, said structure comprising:

a register mode (RM) pair of emitter coupled transistors, included in said master latch, with a right hand side transistor (RHS) in said RM pair having its collector coupled to a master RHS terminal and with a left hand side (LHS) transistor in said RM pair having its collector coupled to a master LHS terminal, and with the bases of the transistors in said RM pair coupled to receive the register input data;

an RM select transistor having its collector coupled to the coupled emitters of said RM transistor pair, its emitter coupled to a master constant current source, and its base coupled to receive an RM select signal;

a scan mode (SM) pair of emitter coupled transistors, included in said master latch, with an RHS transistor in said SM pair having its collector coupled to said master RHS terminal and with an LHS transistor in said RM pair having its collector coupled to said master LHS terminal, with the bases of the transistors in said SM pair coupled to receive the scan register input data;

an SM select transistor having its collector coupled to the coupled emitters of said SM transistor pair, its emitter coupled to said master constant current source, and its base coupled to receive an SCLK select signal;

a master latch mode (MLM) pair of emitter coupled transistors, included in said master latch, with an RHS transistor in said MLM pair having its collector coupled to said master RHS terminal and with an LHS transistor in said MLM pair having its collector coupled to said master LHS terminal, with the base of RHS transistor in said MLM pair coupled to said master LHS terminal and with the base of the LHS transistor in said MLM pair coupled to said master RHS terminal;

an MLM select transistor having its collector coupled to the coupled emitters of said MLM transistor pair, its emitter coupled to said master constant current source, and its base coupled to receive a MCLK select signal;

means for generating a set of voltage levels $V_{CL}$, $V_C$, $V_{CH}$, and $V_{SCLKH}$ with the magnitudes of said voltage levels selected so that $V_{CL} < V_C < V_{CH} < V_{SCLKH}$; and means for controllably setting the magnitudes of said RM, SCLK, and MCLK select signals to selected ones of said voltage levels to couple either the emitters of said RM pair to said master current source to establish voltage levels at said master RHS and LHS terminals corresponding to the register input data, to couple the emitters of said SM pair to said master current source to establish voltage levels at said master RHS and LHS terminals corresponding to the scan register input data, or to couple the emitters of said LM pair to said master current source to latch the previously established RM or SM voltage levels on said master RHS and LHS terminals wherein MCLK swings around $V_C$ and SCLK swings around MCLK so that SCLK runs on an expanded swing and overrides MCLK.

19. The invention of claim 18 further comprising:

a slave transparent mode (STM) pair of emitter coupled transistors, included in said slave latch, with an RHS transistor in said STM pair having its collector coupled to an output RHS terminal and with an LHS transistor in said STM pair having its collector coupled to an output LHS terminal, with the base of the RHS transistor in said STM pair coupled to respond to the voltage levels on said master RHS terminal and with the base of said LHS transistor in said STM pair coupled to respond to the voltage levels on said master LHS terminal;

an STM select transistor having its collector coupled to the coupled emitters of said STM transistor pair, its emitter coupled to a slave constant current source, and its base coupled to receive said MCLK select signal;

a latch element mode (LEM) pair of emitter coupled transistors, included in said slave latch, with an RHS transistor in said LEM pair having its collector coupled to said output RHS terminal and with an LHS transistor in said RM pair having its collector coupled to said output LHS terminal, with the bases of the transistors in said LEM pair coupled to receive the register input data;

an LEM select transistor having its collector coupled to the coupled emitters of said LEM transistor pair, its emitter coupled to said slave constant current source, and its base coupled to receive an LEM select signal;

a slave latch mode (SLM) pair of emitter coupled transistors, included in said slave latch, with an RHS transistor in said SLM pair having its collector coupled to said output RHS terminal and with an LHS transistor in said SLM pair having its collector coupled to said output LHS terminal, with the base of RHS transistor in said SLM pair coupled to said output LHS terminal and with the base of the LHS transistor in said MLM pair coupled to said output RHS terminal;

a first SLM select transistor having its collector coupled to the coupled emitters of said SLM transistor pair, its emitter coupled to said master constant current source, and its base coupled to receive a SLM select signal;

a second SLM select transistor having its collector coupled to the coupled emitters of said SLM transistor pair, its emitter coupled to said master constant current source, and its base coupled to receive said SCLK select signal; and means for controllably setting the magnitudes of said LEM, and SLM select signals to selected ones of said voltage levels to couple either the emitters of said STM pair to said slave current source to establish voltage levels at said output RHS and LHS terminals corresponding to the voltage levels on said master RHS and LHS terminals, or to couple the emitters of said LEM pair to said master current source to establish voltage levels at said output RHS and LHS terminals corresponding to the register input data received at the bases of the transistors in said LEM pair.

20. The invention of claim 19 wherein said means for setting the magnitudes of said RM, SM, MCLK, LEM, and SLM select signals comprises:

means for setting the magnitudes of said RM and SLM select signals to $V_C$;

means for setting the magnitudes of said MCLK select signal to $V_{CL}$, of said SCLK select signal to $V_{CL}$, and of said LEM select signal to $V_{CL}$, to establish a first set of voltage levels on said master terminals corresponding to the register input data, and to latch a set of voltage levels previously established on said master terminals on said output terminals;

means for setting the magnitudes of said MCLK select signal to $V_{CH}$, of said SCLK select signal to $V_{CL}$, and of said LEM select signal to $V_{CL}$, to latch said first set of voltage levels on said master terminals and to establish said first set of voltage levels on said output terminals;

means for setting the magnitudes of said MCLK select signal to $V_{CL}$, of said SCLK select signal to $V_{SCLKH}$, and of said LEM select signal to $V_{CL}$, to establish a second set of voltage levels on said master terminals corresponding to the scan input data while the first set of voltage levels remains latched on said output terminals;

means for setting the magnitudes of said MCLK select signal to $V_{CH}$, of said SCLK select signal to $V_{CL}$, and of said LEM select signal to $V_{CL}$, to latch said second set of voltage levels on said master terminals and to establish said second set of voltage levels on said output terminals;

means for setting the magnitudes of said MCLK select signal to $V_{CH}$, of said SCLK select signal to $V_{SCLKH}$, and of said LEM select signal to $V_{CL}$, to establish a third set of voltage levels on said master terminals corresponding to the scan input data while the second set of voltage levels remain latched at said output terminals; and means for setting the magnitudes of said MCLK select signal to $V_{CL}$, of said SCLK select signal to $V_{CL}$, and of said LEM select signal to $V_{CL}$, to establish a fourth set of voltage levels on said master terminals corresponding to the register input data while the third set of voltage levels remain latched at said output terminals.

21. The invention of claim 20 wherein said means for setting the magnitudes of said RM, SM, MCLK, LEM, and SLM select signals further comprises:

means for setting the magnitudes of said MCLK select signal to $V_{CL}$ and said SCLK select signal to $V_{CL}$ to operate in the latch mode, for setting the magnitude of said LEM select signal to $V_{CH}$, to establish a fifth set of voltage levels on said output terminals corresponding to the register input data and for setting the magnitude of said LEM select signal to $V_{CL}$, to latch said fifth set of voltage levels on said output terminals.

22. The invention of claim 18 further comprising:

a slave transparent mode (STM) pair of emitter coupled transistors, included in said slave latch, with an RHS transistor in said STM pair having its collector coupled to an output RHS terminal and with an LHS transistor in said STM pair having its collector coupled to an output LHS terminal, with the base of the RHS transistor in said STM pair coupled to respond to the voltage levels on said master RHS terminal and with the base of said LHS transistor in said STM pair coupled to respond to the voltage levels on said master LHS terminal;

an STM select transistor having its collector coupled to the coupled emitters of said STM transistor pair, its emitter coupled to a slave constant current source, and its base coupled to receive said MCLK select signal;

a latch element mode (LEM) pair of emitter coupled transistors, included in said slave latch, with an RHS transistor in said LEM pair having its collector coupled to said output RHS terminal and with an LHS transistor in said RM pair having its collector coupled to said output LHS terminal, with the bases of the transistors in said LEM pair coupled to receive the register input data;

an LEM select transistor having its collector coupled to the coupled emitters of said LEM transistor pair, its emitter coupled to said slave constant current source, and its base coupled to receive an LEM select signal;

a slave latch mode (SLM) pair of emitter coupled transistors, included in said slave latch, with an RHS transistor in said SLM pair having its collector coupled to said output RHS terminal and with an LHS transistor in said SLM pair having its collector coupled to said output LHS terminal, with the base of RHS transistor in said SLM pair coupled to said output LHS terminal and with the base of the LHS transistor in said MLM pair coupled to said output RHS terminal;

a SLM select transistor having its collector coupled to the coupled emitters of said SLM transistor pair, its emitter coupled to said master constant current source, and its base coupled to receive a SLM select signal; and means for controllably setting the magnitudes of said LEM, and SLM select signals to selected ones of said voltage levels to couple either the emitters of said STM pair to said slave current source to establish voltage levels at said output RHS and LHS terminals corresponding to the voltage levels on said master RHS and LHS terminals, or to couple the emitters of said LEM pair to said master current source to establish voltage levels at said output RHS and LHS terminals corresponding to the register input data received at the bases of the transistors in said LEM pair.

23. The invention of claim 19 wherein said means for setting the magnitudes of said RM, MCLK, LEM, and SLM select signals comprises:

means for setting the magnitude SLM select signals to $V_C$;

means for setting the magnitudes of said RM select signal to $V_C$, and of said LEM select signal to $V_{CL}$ to operate in the register mode and to set the magnitude of said MCLK select signal to $V_{CL}$ to establish a first set of voltage levels on said master terminals corresponding to the register input data, and to latch a set of voltage levels previously established on said master terminals and for setting the magnitude of said MCLK select signal to $V_{CH}$ to latch said first set of voltage levels on said master terminals and to establish said first set of voltage levels on said output terminals; and means for setting the magnitudes of said RM select signal to $V_{CL}$, and of said LEM select signal to $V_{CL}$ to operate in the scan mode and to set the magnitude of said MCLK select signal to $V_{CL}$ to establish a second set of voltage levels on said master terminals corresponding to the scan register input data, and to latch said first set of voltage levels on said output terminals and for setting the magnitude of said MCLK select signal to $V_{CH}$ to latch said second set of voltage levels on said master terminals and to establish said second set of voltage levels on said output terminals.

24. The invention of claim 23 wherein said means for setting the magnitudes of said RM, MCLK, LEM, and SLM select signals further comprises:
   means for setting the magnitudes of the MCLK signal to $V_{CL}$ and said RM signal to $V_C$ to operate in the latch mode, for setting the magnitude of said LEM select signal to $V_{CL}$ establish a third set of voltage levels on said output terminals corresponding to the register input data and for setting said LEM select signal to $V_{CH}$ to latch said third set of voltage levels on said master terminals and to establish said third set of voltage levels on said output terminals.

25. An emitter coupled logic (ECL) circuit structure for receiving register input data and register scan input data, that selectively functions as a register to transfer the received register input data to a set of output terminals (register mode), as a scan register to transfer the received scan register data to the output terminals (scan mode), or as a latch element for the received register data (latch mode), with the circuit structure including coupled master and slave latches, said structure comprising:
   a register mode (RM) pair of emitter coupled transistors, included in said master latch, with a right hand side transistor (RHS) in said RM pair having its collector coupled to a master RHS terminal and with a left hand side (LHS) transistor in said RM pair having its collector coupled to a master LHS terminal, and with the bases of the transistors in said RM pair coupled to receive the register input data;
   an RM select transistor having its collector coupled to the coupled emitters of said RM transistor pair, its emitter coupled to a master constant current source, and its base coupled to receive an RM select signal;
   a scan mode (SM) pair of emitter coupled transistors, included in said master latch, with an RHS transistor in said SM pair having its collector coupled to said master RHS terminal and with an LHS transistor in said RM pair having its collector coupled to said master LHS terminal, with the bases of the transistors in said SM pair coupled to receive the scan register input data;
   an SM select transistor having its collector coupled to the coupled emitters of said SM transistor pair, its emitter coupled to said master constant current source, and its base coupled to receive an SM select signal being the inverted RM select signal;
   a master latch mode (MLM) pair of emitter coupled transistors, included in said master latch, with an RHS transistor in said MLM pair having its collector coupled to said master RHS terminal and with an LHS transistor in said MLM pair having its collector coupled to said master LHS terminal, with the base of RHS transistor in said MLM pair coupled to said master LHS terminal and with the base of the LHS transistor in said MLM pair coupled to said master RHS terminal;
   an MLM select transistor having its collector coupled to the coupled emitters of said MLM transistor pair, its emitter coupled to said master constant current source, and its base coupled to receive a MCLK select signal;
   means for generating a set of voltage levels $V_{CL}$, $V_C$, and $V_{CH}$ with the magnitudes of said voltage levels selected so that $V_{CL} < V_C < V_{CH}$; and
   means for controllably setting the magnitudes of said RM and MCLK select signals to selected ones of said voltage levels to couple either the emitters of said RM pair to said master current source to establish voltage levels at said master RHS and LHS terminals corresponding to the register input data, to couple the emitters of said SM pair to said master current source to establish voltage levels at said master RHS and LHS terminals corresponding to the scan register input data, or to couple the emitters of said LM pair to said master current source to latch the previously established RM or SM voltage levels on said master RHS and LHS terminals.

* * * * *